United States Patent [19]

Chen

[11] Patent Number: 5,731,234
[45] Date of Patent: Mar. 24, 1998

[54] PROCESS FOR GLOBAL PLANARIZATION OF MEMORY AND GLOBALLY PLANARIZED MEMORY

[75] Inventor: Anchor Chen, Pingtung, Taiwan

[73] Assignee: United Microelectronics Corporation, Taiwan

[21] Appl. No.: 669,965

[22] Filed: Jun. 25, 1996

[30] Foreign Application Priority Data

May 14, 1996 [TW] Taiwan ................. 85105702

[51] Int. Cl.$^6$ ................................. H01L 21/70
[52] U.S. Cl. .................. 438/238; 438/241; 438/239
[58] Field of Search ...................... 437/47, 48, 52, 437/60, 919; 438/238, 239, 241

[56] References Cited

U.S. PATENT DOCUMENTS 5,374,579 12/1994 Kuroda ........................ 437/52
5,486,712 1/1996 Arima ........................ 257/296

OTHER PUBLICATIONS

S. Wolf and R.N. Tauber, "Silicon Processing for the VLSI Era vol. 1—Process Technology", Lattice Press, p. 1, 1986.
S.Wolf, "Silicon Processing for the VLSI Era vol. 2—Process Integration", Lattice Press, pp. 208, 334–335 & 572–581, 1990.

Primary Examiner—John Niebling
Assistant Examiner—Joni Y. Chang
Attorney, Agent, or Firm—Rabin, Champagne & Lynt, P.C.

[57] ABSTRACT

A process for the global planarization of a memory circuit and globally planarized memory. The process includes defining a memory cell circuit area and a peripheral circuit area on a silicon substrate. A memory cell MOS transistor is formed in the memory cell circuit area and at least two peripheral circuit MOS transistors are formed in the peripheral circuit area. A memory cell electronic component is then formed in the memory cell circuit area and in the peripheral circuit area from a plurality of thin film layers. The thin film layers are defined in the peripheral circuit area such that an open circuit is formed between the thin film layers and the peripheral circuit MOS transistors. A planarized insulating layer is then formed on top of the silicon substrate.

10 Claims, 5 Drawing Sheets

PROCESS FOR GLOBAL PLANARIZATION OF MEMORY AND GLOBALLY PLANARIZED MEMORY

BACKGROUND OF THE INVENTION

1. Field of the Invention

The invention relates in general to a method of manufacturing a memory integrated circuit and to globally planarize memory, and more particularly to a method of manufacturing memory components that are globally planarized and result in a reduction of the height difference between the memory cell circuit area and the peripheral circuit area.

2. Description of the Related Art

Memory is commonly classified into two main types, namely, read only memory (ROM) and random access memory (RAM). The former is capable of performing read operations only, while the latter is capable of performing both read and write operations. Random access memory can be further classified according to the way information is processed inside the memory into either dynamic random access memory (DRAM) or static random access memory (SRAM).

DRAM is a widely used memory component. The steps involved in manufacturing conventional DRAM are illustrated in FIGS. 1A to 1D. First, referring to FIG. 1A, a memory cell circuit area 56 and a peripheral circuit area 58 are defined on top of a silicon substrate 10. A field oxide layer 11, a gate terminal 12, source/drain terminals 13 and an insulating oxide layer $OX_1$ are formed in the memory cell circuit area 56. Similarly, a field oxide layer 14, a gate terminal 15, source/drain terminals 16, and an insulating oxide layer $OX_2$ are also formed in the peripheral circuit area 58.

Referring to FIG. 1B, the insulating oxide layer $OX_1$ of the predefined contact window 60 is selectively etched until the source/drain terminal 13 is exposed. A second polysilicon layer 17 is then deposited covering the memory cell circuit area 56 above silicon substrate 10.

Referring to FIG. 1C, the second polysilicon layer 17 is selectively etched to form a storage terminal 18 connected by a contact window to the source/drain terminal 13. A dielectric layer 19 is then formed covering the surface of storage terminal 18. Thereafter, a third polysilicon layer 20 is formed on the surface of dielectric layer 19 to act as the cell terminal. An insulating layer 21 is then deposited on top of the silicon substrate 10 covering the memory cell circuit area 56 as well as the peripheral circuit area 58.

Lastly, referring to FIG. 1D, contact windows are formed in predetermined positions. For example, a contact window 22 is shown above the source/drain terminal 16. It is formed by selectively etching the insulating layer 21 and insulating oxide layer $OX_2$ in the peripheral circuit area 58. A conducting material, such as tungsten, is then used to fill up the contact opening. Next, a metalization process is performed. For example, a metallic layer, such as aluminum, is formed above the insulating layer 21 in both the memory cell circuit area 56 and the peripheral circuit area 58. Subsequently, the metallic layer is selectively etched to form the conducting wires 23 and 24.

Employing the conventional DRAM manufacturing method of forming a capacitor comprising a storage terminal 18, a dielectric layer 19, and a third polysilicon layer 20 in the memory cell circuit area 56, there will be a considerable difference in height created between the memory cell circuit area 56 and the peripheral circuit area 58, which will lead to poorer structural quality in subsequent processes. For example, conducting wires 23 and 24 are formed by the selective etching of the metallic layer, as described above. But prior to that, a layer of photoresist needs to be deposited on the surface of the metallic layer, and then illuminated by a light source through a patterned photomask so that the photosensitive chemicals within the photoresist will react to define the etching areas. Due to the difference in height between the memory cell circuit area 56 and the peripheral circuit area 58, there will be an insufficient depth of focus that will cause defocusing during exposure. As a result, the pattern generated on the photoresist will be slightly deformed. Consequently, there will be a greater resistance in the conducting wires, such as wire 23, after the metallic layer is selectively etched.

To solve the problem of height difference described above, chemical-mechanical polishing (CMP) methods are generally used. This kind of global planarization technique makes use of a mechanical type of polishing together with a suitable choice of a chemical reagent, such as a slurry made from a mixture of plasticized silicates and potassium hydroxide (KOH). This operation is carried out under suitable controlling parameter settings to obtain the best planarity. However, the list of controlling parameters is long and includes the composition of the slurry, the pressure exerted on the silicon wafer, the rotating speed and composition of the polishing pad, as well as the distribution, temperature, and pH of the polishing particles. Furthermore, the major controlling parameters need to be alterable, according to the type of material being polished. For this reason, there are operational difficulties in controlling this chemical-mechanical polishing process to achieve the necessary quality in global planarization. Additionally, it is costly and time consuming.

SUMMARY OF THE INVENTION

It is therefore an object of the invention to provide a method of manufacturing globally planarized memory, whereby the problem created by the difference in height between the memory cell circuit area and the peripheral circuit area is diminished, and the quality in subsequent processing steps is ensured.

In a preferred embodiment, the invention is directed to a method of manufacturing globally planarized memory, wherein the memory comprises more than one memory cell, and each memory cell comprises at least one MOS transistor and at least one other electronic component. The method includes the steps of defining a memory cell circuit area and a peripheral circuit area on a silicon substrate. A memory cell MOS transistor is formed in the memory cell circuit area and at least two peripheral circuit MOS transistors are formed in the peripheral circuit area. A memory cell electronic component is then formed from a plurality of thin film layers in the memory cell circuit area and in the peripheral circuit area. The thin film layers in the peripheral circuit area are then defined such that an open circuit is formed between the thin film layers and the peripheral circuit MOS transistors. A planarized insulating layer is then formed on top of the silicon substrate.

In another embodiment, the invention is directed to globally planarized memory, wherein the memory includes more than one memory cell, and each memory cell includes at least one MOS transistor and at least one other electronic component. The globally planarized memory is manufactured by a process which includes the steps of the method described above.

BRIEF DESCRIPTION OF THE DRAWINGS

Other objects, features, and advantages of the invention will become apparent from the following detailed description of the preferred, but non-limiting, embodiment. The description is made with reference to the accompanying drawings in which.

DESCRIPTION OF THE PREFERRED EMBODIMENT

FIGS. 2A to 2E are cross-sectional views showing the manufacturing flow according to one preferred embodiment of the present invention. Memory cell circuit area is represented on the left hand side of those figures, while peripheral circuit area is represented on the fight hand side of the figures.

Figure 1A:
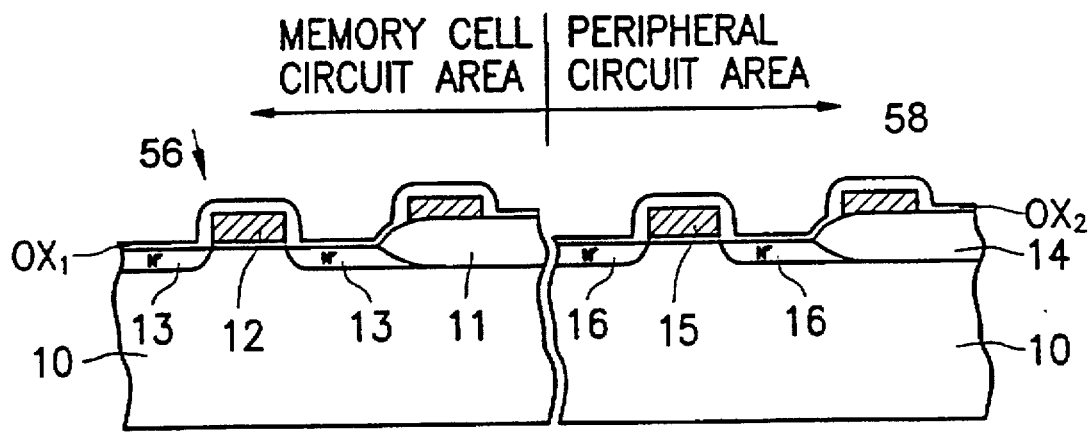
FIGS. 1A to 1D are cross-sectional views showing the conventional manufacturing flow of a DRAM cell.
Figure 1B:
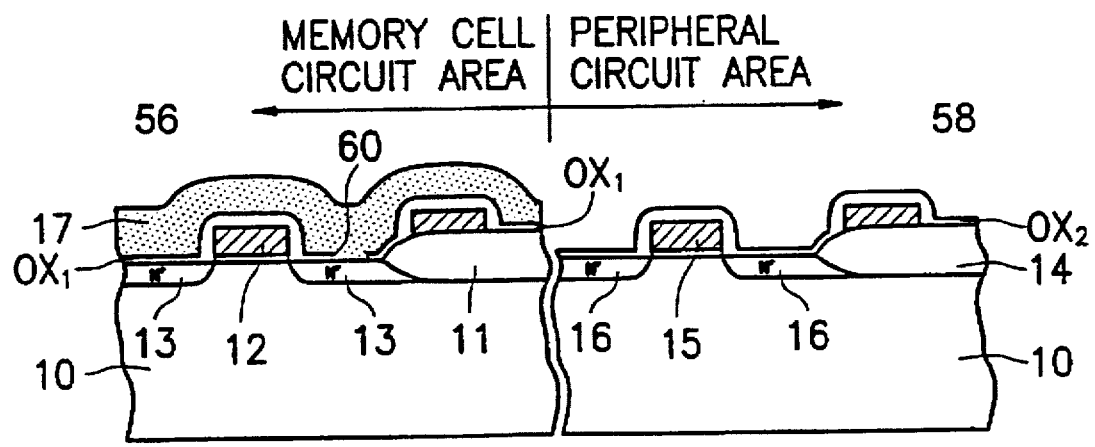
Figure 1C:
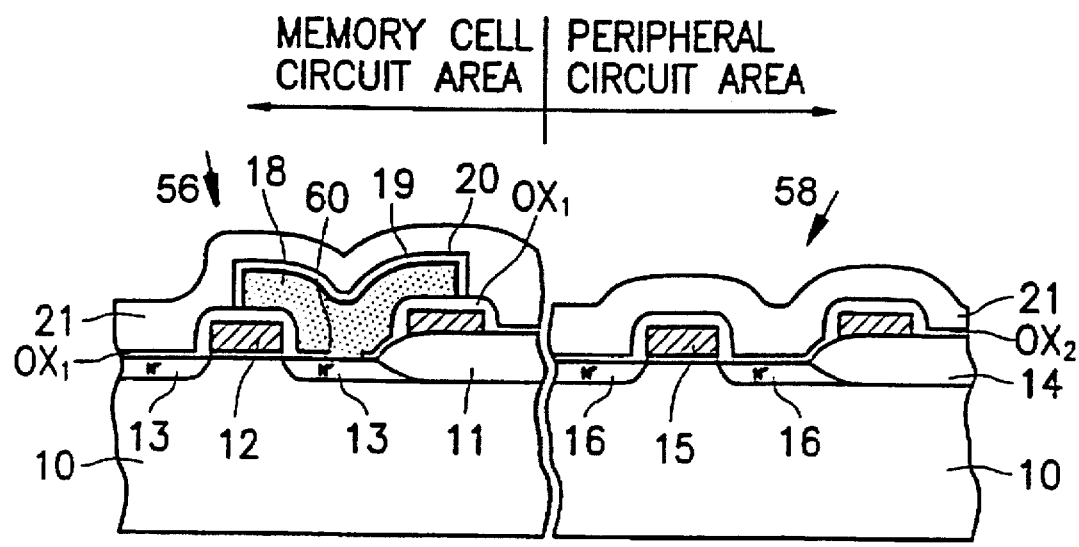
Figure 1D:
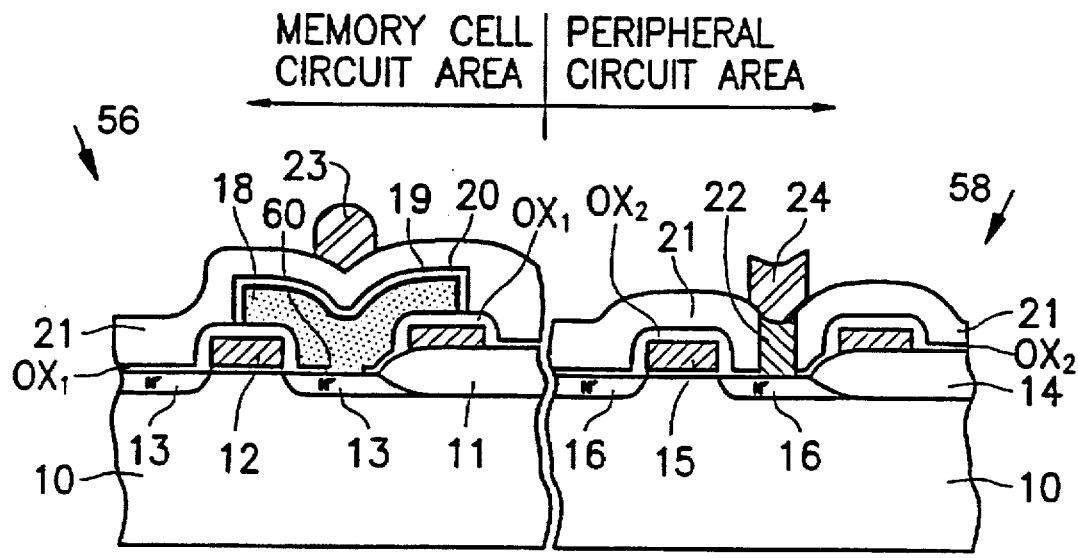
Figure 2A:
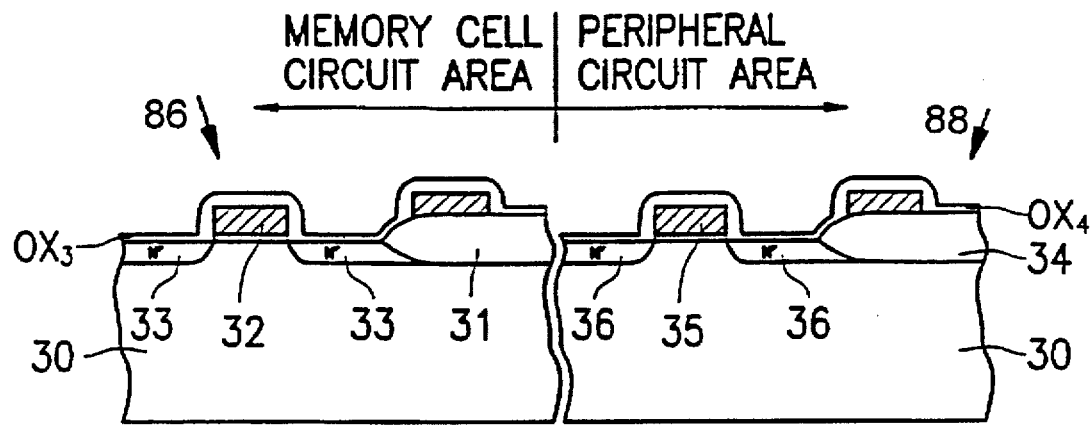
FIGS. 2A to 2E are cross-sectional views showing the manufacturing flow according to one preferred embodiment of the invention.

First, referring to FIG. 2A, a memory cell circuit area 86 and a peripheral circuit area 88 are defined above a silicon substrate 30. A field oxide layer 31, a gate terminal 32, source/drain terminals 33, and an insulating oxide layer $OX_3$ are formed within the memory cell circuit area 86. Similarly, a field oxide layer 34, a gate terminal 35, source/drain terminals 36, and an insulating oxide layer $OX_4$ are formed within the peripheral circuit area 88.

Figure 2B:
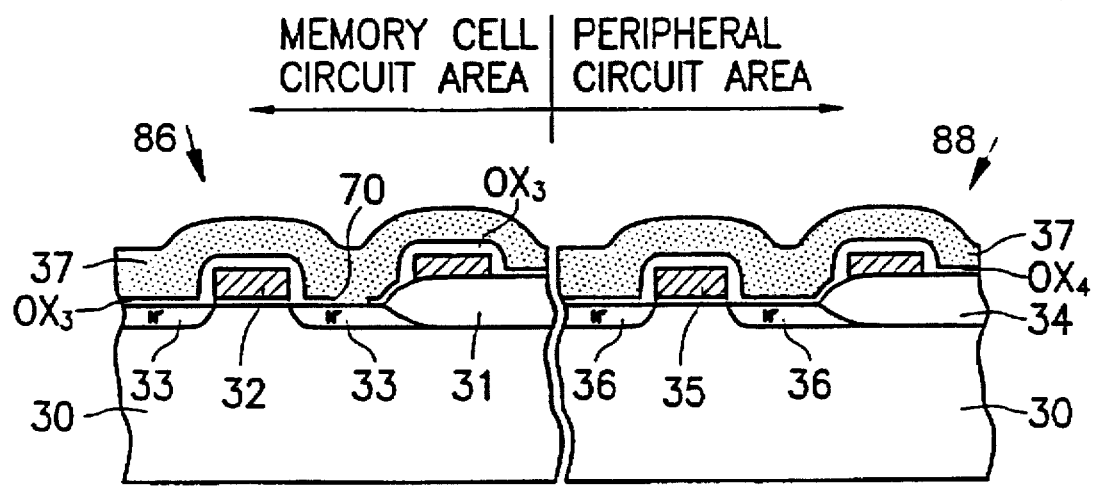
Figure 2C:
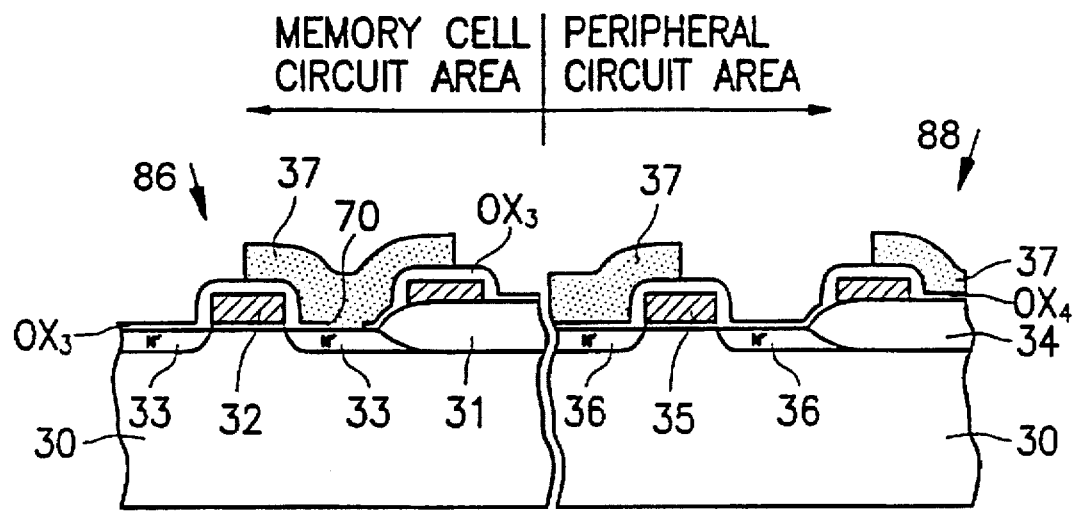

Referring to FIG. 2B, a portion of the insulating oxide layer $OX_3$ lying over the contact window (not shown in this Figure) is selectively etched to expose the source/drain terminal 33. Next, a second polysilicon layer 37 is formed above the memory cell circuit area 86 and the peripheral circuit area 88 of the silicon substrate 30, for example, by using a chemical vapor deposition (CVD) method. Next, referring to FIG. 2C, the second polysilicon layer 37 lying over the memory cell circuit area 86 is selectively etched until a storage terminal is formed, while the portion of the second polysilicon layer 37 lying over the peripheral circuit area 88 is selectively etched until a contact opening is formed above the source/drain terminal 36.

Figure 2D:
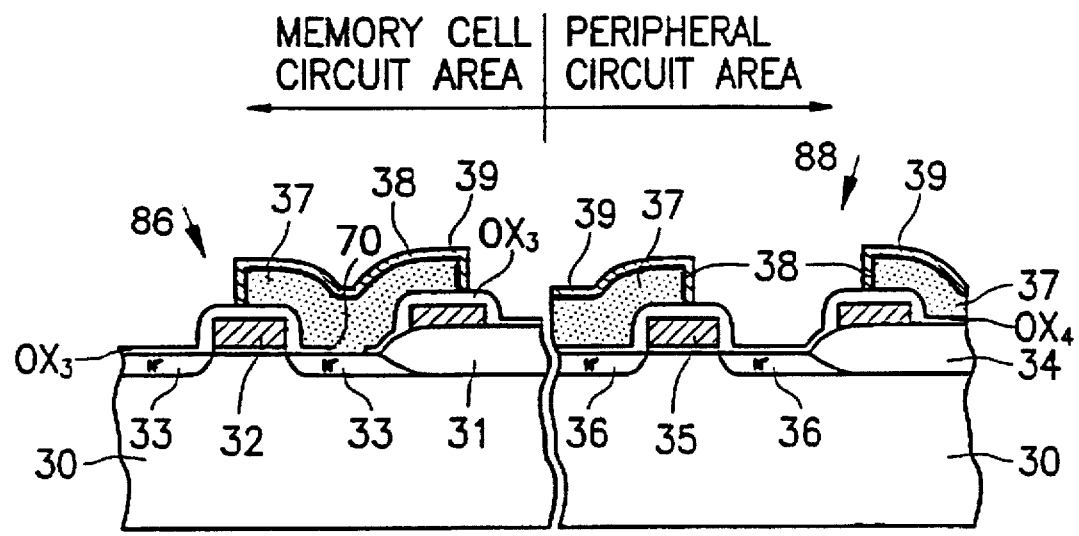

Thereafter, referring to FIG. 2D, a CVD method is used to form a dielectric layer 38 on the surface of the second polysilicon layer 37 that lies above both the memory cell circuit area 86 and the peripheral circuit area 88. The dielectric layer can be either of the nitride/oxide (NO) type or the oxide/nitride/oxide (ONO) type. Then, a third polysilicon layer 39 is formed covering the dielectric layer in the two areas mentioned above. At this stage, a capacitor is formed in the memory cell circuit area 86 through the combination of the second polysilicon layer 37, the dielectric layer 38, and the third polysilicon layer 39. However, no electronic devices are formed by the second polysilicon layer 37, the dielectric layer 38, and the third polysilicon layer 39 in the peripheral circuit area 88. Moreover, an open circuit condition is created between MOS transistors in the peripheral circuit area 88.

Figure 2E:
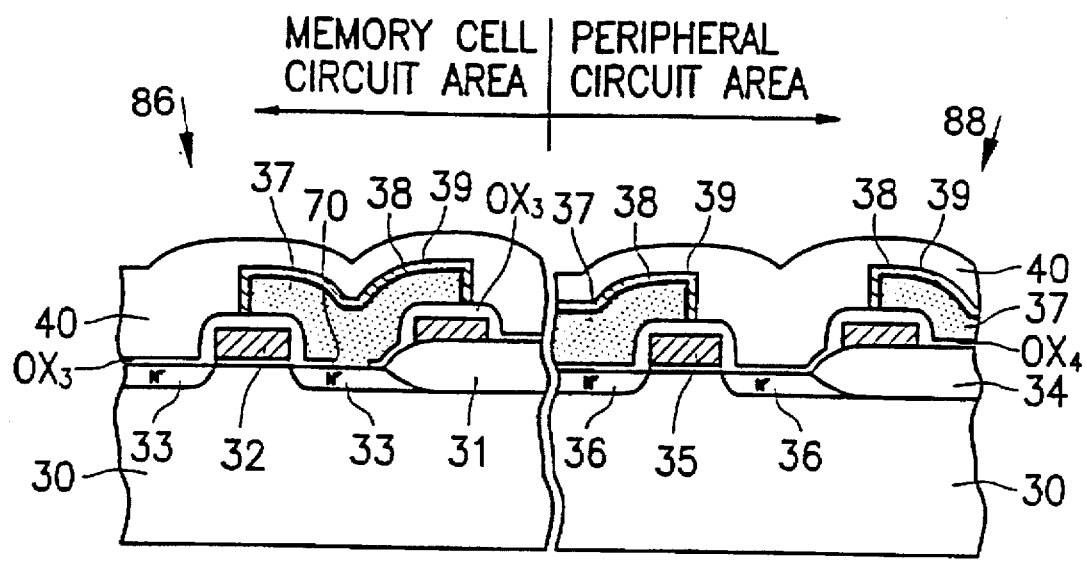

Lastly, referring to FIG. 2E, a CVD process is employed to form a planarized insulating layer 40, which can be made from borophosphosilicate glass (BPSG), over the surface of the memory cell circuit area 86 and the peripheral circuit area 88 of the silicon substrate 30, as well as over the surface of the third polysilicon layer 39.

Figure 3:
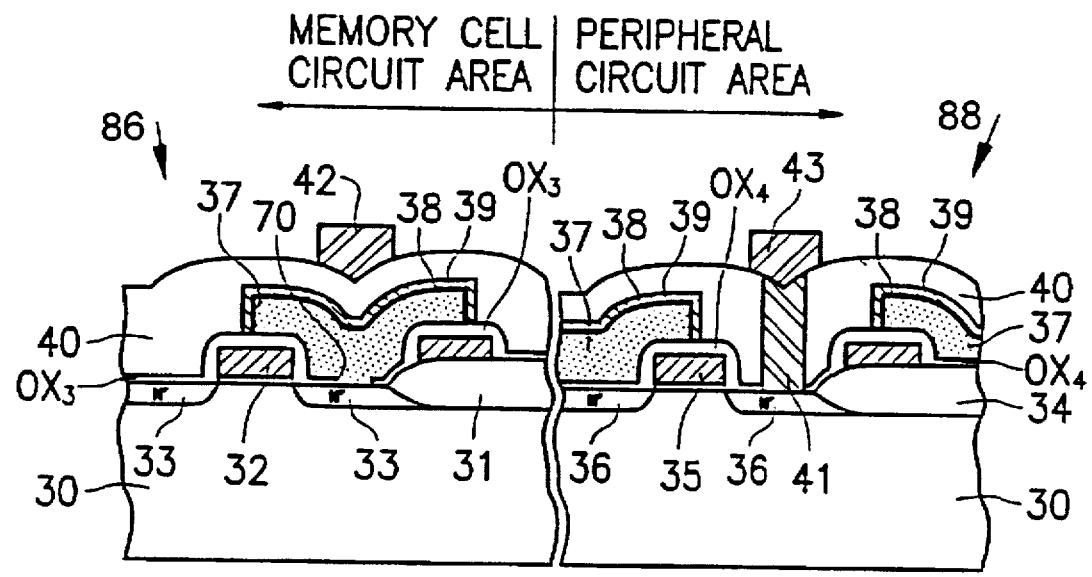
FIG. 3 is a cross-sectional view showing subsequent processing steps after the manufacturing flow according to one preferred embodiment of the invention.

In the preferred embodiment described above, the difference in height between the memory cell circuit area 86 and the peripheral circuit area 88 is almost non-existent, and therefore the product quality in subsequent processes can be ensured. Subsequent processes after the formation of the planarized insulating layer 40 can be seen by reference to FIG. 3. At least one contact window 41, for example, may be formed in a pre-determined position by selectively etching into a portion of the planarized insulating layer 40 and then the insulating oxide layer $OX_4$ to expose the source/drain terminal 36 underneath. Next, the contact window 41 is filled up with a conducting material, such as tungsten, followed by the deposition of a metallic layer simultaneously in the memory cell circuit area 86 and the peripheral circuit area 88. Finally, conducting wires 42 and 43 are formed by selective etching of the metallic layer. Since there is substantially no height difference between the areas described above, defects, such as large resistances for the conducting wires arising from defocusing, are greatly diminished.

From the preferred embodiments described above, those skilled in the art will readily see that problems caused by a height difference between the memory cell area 86 and the peripheral circuit area 88 are resolved by the invention. The method of the invention does not require the use of such a global planarization technique as chemical-mechanical polishing, but can nevertheless diminish problems, such as higher resistances for the conducting wires, or other problems caused by surface unevenness inherent in the conventional manufacturing method. The invention is suitable not only for manufacturing DRAM cells, but also for manufacturing other memory components as well. For example, using the manufacturing method of the invention, the problem of surface unevenness in an SRAM in which the electronic component formed from a plurality of thin film layers in the memory cell and peripheral circuit area is a load resistor, can similarly be solved.

While the invention has been described by way of example and in terms of a preferred embodiment, it is to be understood that the invention is not limited thereto. On the contrary, it is intended that the invention cover various modifications and similar arrangements. Thus, the appended claims should be accorded the broadest interpretation commensurate with encompassing all such modifications and similar structures.

What is claimed is:

1. A method of manufacturing globally planarized memory, wherein the memory comprises more than one memory cell, and each memory cell comprises at least one MOS transistor and at least one other electronic component, comprising:

(a) defining a memory cell circuit area and a peripheral circuit area on a silicon substrate;

(b) forming a memory cell MOS transistor in the memory cell circuit area and forming more than one peripheral circuit MOS transistor in the peripheral circuit area;

(c) forming a plural number of thin film layers in the memory cell circuit area and in the peripheral circuit area;

(d) defining the plural number of thin film layers in the memory cell circuit area so as to form a memory cell electronic component in the memory cell circuit area, and further defining the thin film layers in the peripheral circuit area such that an open circuit is formed between the peripheral circuit MOS transistors while retaining each of the plural number of thin film layers in the peripheral circuit area; and (e) forming a planarized insulating layer on top of the silicon substrate over the plural number of thin film layers, in both the memory cell circuit area and the peripheral circuit area.

2. A method according to claim 1, wherein the memory is dynamic random access memory.

3. A method according to claim 2, wherein the electronic component is a capacitor.

4. A method according to claim 1, wherein the memory is static random access memory.

5. A method according to claim 4, wherein the electronic component is a load resistor.

6. A method according to claim 1, wherein the planarized insulating layer is borophosphosilicate glass.

7. A method according to claim 1, wherein the plural number of thin film layers includes three thin film layers.

8. A method according to claim 7, wherein the three thin film layers includes a first polysilicon layer, a dielectric layer and a second polysilicon layer, and the electronic component is a capacitor.

9. A method according to claim 1, further comprising:
(f) forming a contact window in the peripheral circuit area to expose a source/drain terminal;
(g) filling the contact window with a conducting material; and
(h) depositing simultaneously a metallic layer in the memory cell circuit area and the peripheral circuit area and forming conducting wires therefrom.

10. A method according to claim 1, wherein the forming a planarized insulating layer comprises forming the planarized insulating layer by CVD.

* * * * *